United States Patent [19]
Chen

[11] Patent Number: 5,705,435
[45] Date of Patent: Jan. 6, 1998

[54] CHEMICAL-MECHANICAL POLISHING (CMP) APPARATUS

[75] Inventor: Lai-Tuh Chen, Hsin-Chu, Taiwan

[73] Assignee: Industrial Technology Research Institute, Hsinchu, Taiwan

[21] Appl. No.: 694,727

[22] Filed: Aug. 9, 1996

[51] Int. Cl.$^6$ ............................................. H01L 21/00
[52] U.S. Cl. ........................... 438/8; 156/345; 438/692; 216/38; 216/85; 216/88
[58] Field of Search .................... 438/8, 16, 691, 438/692, 693, 697; 156/345 LC, 345 LP; 216/38, 85, 88, 91

[56] References Cited

U.S. PATENT DOCUMENTS

| | | | |
|---|---|---|---|
| 5,069,002 | 12/1991 | Sandhu et al. | 438/692 X |
| 5,234,868 | 8/1993 | Cote | 438/692 X |
| 5,413,941 | 5/1995 | Koos et al. | 437/8 |
| 5,439,551 | 8/1995 | Meikle et al. | 438/692 X |

*Primary Examiner*—William Powell
*Attorney, Agent, or Firm*—George O. Saile; Stephen B. Ackerman

[57] ABSTRACT

An improved and new apparatus and process for chemical-mechanical polishing (CMP) the surface of a semiconductor substrate to a planar condition has beed developed. The planarization endpoint, which is independent of topographic pattern density, is detected by monitoring the ratio of the rate of insulator material removal over a pattern feature to the rate of insulator material removal over an area without an underlying pattern feature.

38 Claims, 3 Drawing Sheets

CHEMICAL-MECHANICAL POLISHING (CMP) APPARATUS

BACKGROUND OF THE INVENTION

(1) Field of the Invention

This invention relates to an apparatus and method for chemical-mechanical polishing (CMP) the surface of a semiconductor substrate. More specifically, the invention is directed to a chemical-mechanical polishing (CMP) apparatus containing an in-line planarity measuring device, which detects planarization endpoint, without necessity to remove the substrate from the CMP apparatus, when polishing to a planar condition a semiconductor substrate containing topographic features resulting from deposited and patterned layers.

(2) Description of Related Art

In the fabrication of semiconductor devices, metal conductor lines are used to interconnect the many components in device circuits. The metal conductor lines serve to interconnect discrete devices, and thus form integrated circuits. The metal conductor lines are further insulated from the next interconnection level by thin layers of insulating material and holes formed through the insulating layers provide electrical access between successive conductive interconnection layers. In such wiring processes, it is desirable that the insulating layers have smooth surface topography, since it is difficult to lithographically image and pattern layers applied to rough surfaces. Also, rough surface topography results in poor step coverage by subsequently deposited layers, discontinuity of layers across steps, and void formation between topographic features. Poor step coverage by deposited layers and void formation between topographic features result in degraded process yield and poorer reliabilty of integrated circuits. As wiring densities in semiconductor circuit chips increase, multiple wiring levels are required to achieve interconnection of the devices and, therefore, planarization of the interlevel dielectric material becomes a critical step in the fabrication process.

In semiconductor circuit manufacturing chemical-mechanical polishing (CMP) is one process used to produce smooth surface topography on insulating layers which separate conductive interconnection pattern layers. CMP can also be used to remove different layers of material from the surface of a semiconductor substrate. For example, following via hole formation in an insulating material layer, a metallization layer is blanket deposited and then CMP is used to produce planar metal studs. Briefly, the CMP processes involve holding and rotating a thin, flat substrate of the semiconductor material against a wetted polishing surface under controlled chemical, pressure, and temperature conditions. A chemical slurry containing a polishing agent, such as alumina or silica, is used as the abrasive material. Additionally, the chemical slurry contains selected chemicals which etch various surfaces of the substrate during processing. The combination of mechanical and chemical removal of the material during polishing results in superior planarization of the polished surface. In the polishing processes it is important to remove a sufficient amount of material to provide a smooth surface, without removing an excessive amount of underlying materials. Therefore, a method of detecting when planarization is achieved is needed.

U.S. Pat. No. 5,413,941 entitled "Optical End Point Detection Methods in Semiconductor Planarizing Polishing Processes" granted May 9, 1995 to Daniel A. Koos et al describes a method for endpoint detection for polishing by impinging laser light onto the substrate being polished and measuring the reflected light. The intensity of the reflected light is a measure of the planarity of the polished surface.

Chemical-mechanical planarization of insulator layers has, also, been monitored by measuring the thickness of the insulator layer and relating the amount of layer removed to the state of planarization. This is an unreliable method because the CMP process is dependent on the pattern density which produces the rough topography which is to be planarized. Consider an object whose topography varies in both height of features and lateral dimensions of features. The CMP polish removal rate is increased on features of larger height compared to features with smaller height. Also, planarization of surface features depends upon their lateral dimensions for a given feature height. The local polish removal rate over a feature with small lateral dimensions is higher than the local polish removal rate over a feature with large lateral dimensions. Furthermore, the local polish removal rate on a topographic feature is influenced by the proximity of other topographic features. For example, an isolated feature of a given height will polish faster than a like feature which is closely surrounded by an array of similar features. The inadequacy of ascertaining planarization by merely monitoring thickness of material removed during CMP of semiconductor device structures is readily apparent. Each level of a semiconductor device structure has a different pattern density and this pattern density may vary both locally and globally across the semiconductor substrate. Therefore, merely measuring the thickness of material removed during CMP at an individual site on the substrate does not adequately predict planarization.

In order to reduce process cost and to increase product throughput in a CMP apparatus it is desirable to be able to measure when planarization is achieved without necessity of removing the product from the CMP apparatus for off-line inspections, planarity measurements and polished layer thickness measurements.

The present invention is directed to a novel method and apparatus for chemical-mechanical (CMP) planarization of a semiconductor substrate which contains topographic features, resulting from deposited and patterned layers. The new and improved CMP apparatus contains an in-line substrate cleaning station and an in-line optical thickness measurement station. The new and improved method of detecting CMP planarization endpoint when polishing to a planar condition a semiconductor substrate which contains topographic features, is independent of topographic pattern density and is applicable to planarization of various insulator layers. The CMP apparatus comprises a state-of-the-art chemical-mechanical polish station, a substrate cleaning station and a simple optical film thickness measurement device. Endpoint for planarization of a substrate surface is detected by monitoring the ratio of the rate of removal of the insulator material removal over a pattern feature to the rate of insulator material removal over an area without an underlying pattern feature.

SUMMARY OF THE INVENTION

One object of the present invention is to provide an improved and new apparatus and process for chemical-mechanical polishing (CMP) a semiconductor substrate surface to a planar condition, wherein endpoint for the planarization process is detected by monitoring the ratio of the rate of insulator material removal over a pattern feature to the rate of insulator material removal over an area devoid of an underlying pattern feature.

Another object of the present invention is to provide a new and improved apparatus and process for endpoint detection in a CMP process for planarizing an insulator layer deposited over a patterned metallization layer used to interconnect discrete devices on a semiconductor substrate.

A further object of the present invention is to provide a new an improved CMP apparatus containing an in-line substrate cleaning station, a simple optical film thickness measurement device, and a means to measure the ratio of the rate of removal of insulator material over a pattern feature to the rate of insulator material removal over an area without an underlying pattern feature.

The novel features of the polishing apparatus in accordance with the invention comprise: a rotatable platen and polishing pad for chemical-mechanical polishing (CMP) an insulating layer deposited over a metallization pattern formed on the surface of a semiconductor substrate; a reservoir for a polishing slurry and means to dispense the slurry onto the polishing pad; a rotatable substrate carrier and means for holding the surface of the semiconductor substrate in juxtaposition relative to said rotating polishing pad with an applied pressure between the rotatable substrate carrier and the rotatable platen and polishing pad; a means to transfer the semiconductor substrate from the rotatable substrate carrier to an in-line cleaning station comprising a water spray nozzle and an air spray nozzle; a means to transfer the semiconductor substrate from the in-line cleaning station to an in-line optical thickness measurement tool; a means to align the semiconductor substrate in the in-line optical thickness measurement tool; a means to measure the thickness of the insulating layer over said metallization pattern before and after polishing; a means to measure the thickness of the insulating layer over said semiconductor substrate before and after polishing; a means to compute a first polish removal rate of said insulating layer over said metallization pattern; a means to compute a second polish removal rate of said insulating layer over said semiconductor substrate; a means of computing a polish removal rate ratio by dividing said first polish removal rate by said second polish removal rate; and a means to transfer the semiconductor substrate from the in-line optical thickness measurement tool to the rotatable substrate carrier for additional chemical-mechanical polishing (CMP) until said polish removal rate ratio is less than between about 0.9 to 1.1.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved CMP apparatus and method of polishing the surface of a semiconductor substrate, using chemical-mechanical polishing (CMP), which results in improved detection of planarization independent of topographic pattern density, and without excessive removal of underlying material, will now be described in detail.

Figure 1:
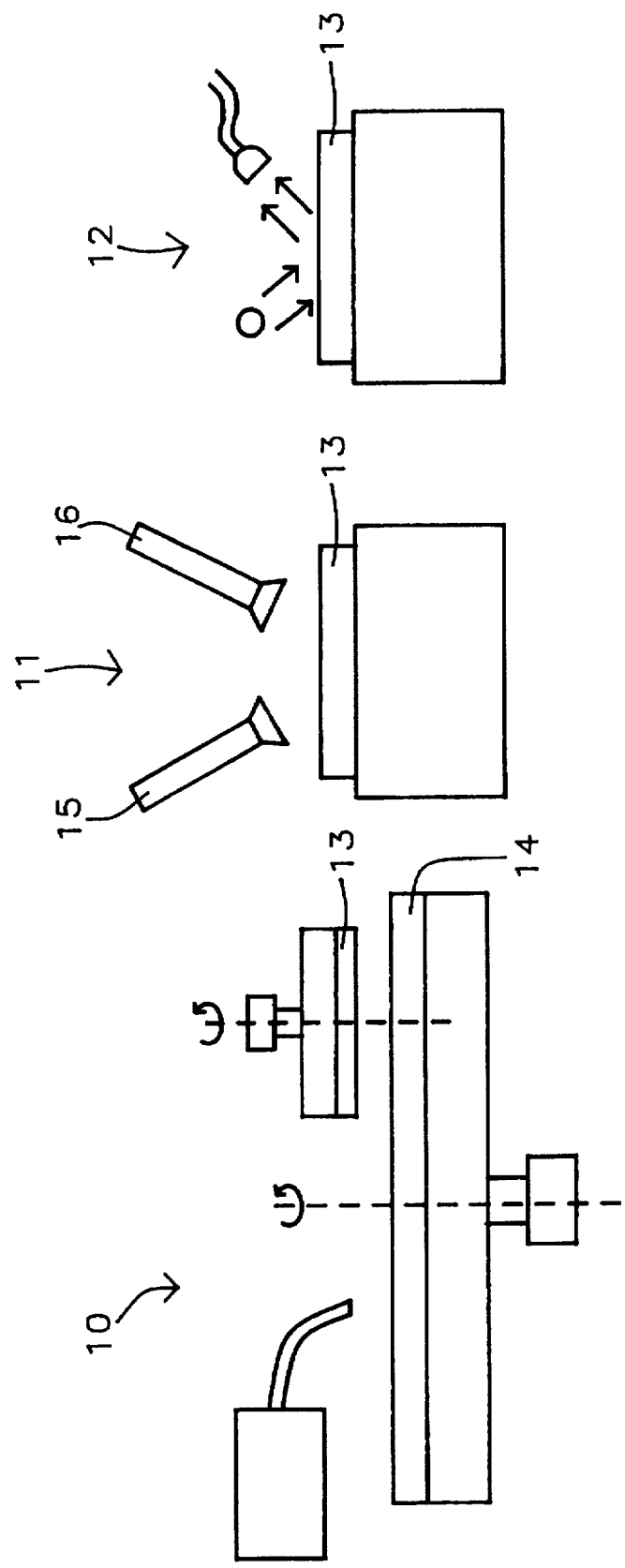
FIG. 1, which schematically, in cross-sectional representation, illustrates the CMP apparatus of the invention.

FIG. 1 schematically shows the combination of a state-of-the-art CMP tool, 10; an in-line substrate cleaning station, 11; and an optical film thickness measurement device, 12. During CMP processing the substrate, 13, is polished for a selected time on the polishing pad, 14, then the substrate, 13, is transferred to the in-line substrate cleaning station, 11, comprising a water spray nozzle, 15, and a air spray nozzle, 16. Polishing slurry is cleaned from the substrate surface by activating the water spray nozzle, 15, and then the substrate surface is dried by activating the air spray nozzle, 16. After the substrate, 13, is cleaned and dried it is transferred to the optical film thickness measurement device, 12. As is usual practice, a substrate flat is used to orient the substrate in a defined location relative to the optical film thickness measurement device.

Figure 2A:
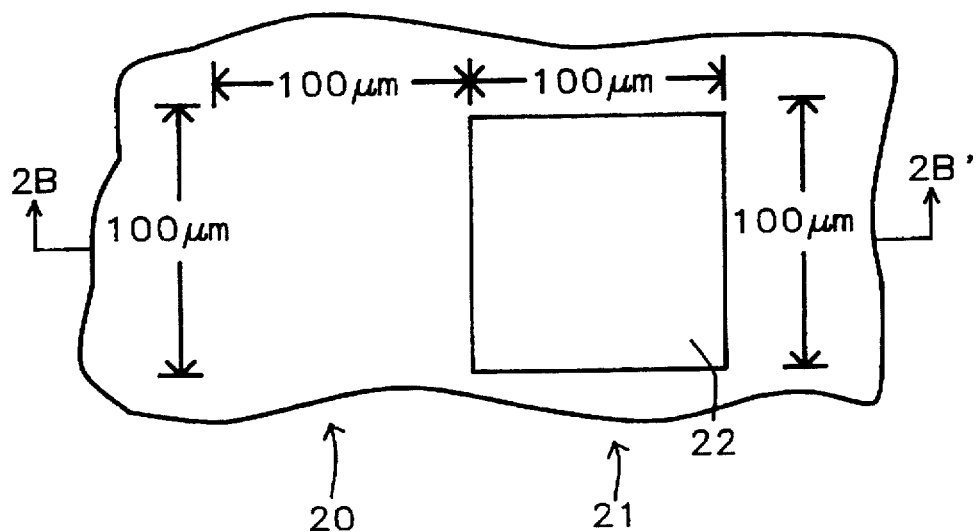
FIG. 2A, which schematically illustrates a top view of the optical alignment mark of the invention.
Figure 2B:
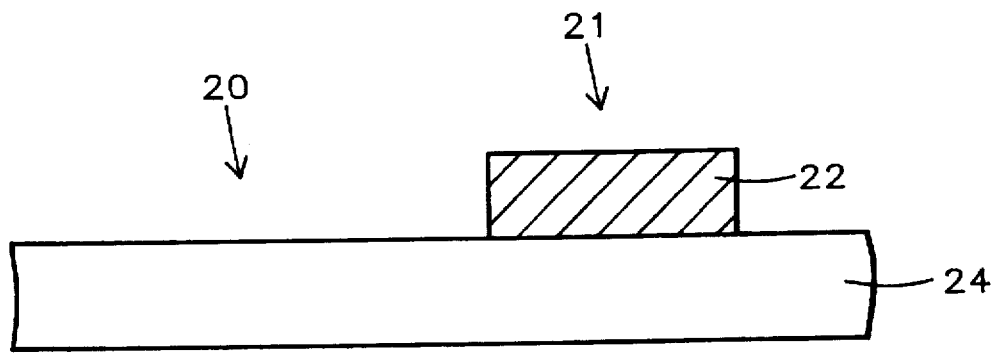
FIG. 2B, which schematically, in cross-sectional representation, illustrates the optical alignment mark shown in FIG. 2A.

The planarization monitoring structure, schematically shown in FIGS. 2A and 2B, is an optical measurement alignment mark, comprising a first area, 20, which is devoid of an underlying topographic producing feature and a second area, 21, which has an underlying topographic producing feature. The lateral dimensions of this optical measurement alignment mark are approximately 100 µm by 100 µm for the first area, 20, and approximately 100 µm by 100 µm for the second area, 21. The lateral dimensions of the two areas of the alignment mark are chosen so that optical thickness measurement techniques, such as optical or laser interferometry, can be implemented in-situ on the CMP polishing apparatus without undue and costly optical tool alignment requirements. Secondly, the lateral dimensions of the second area, 21, which has an underlying topographic producing feature, are chosen so that achievement of planarization over this feature insures planarization of all critical areas of the semiconductor device structure. Lateral dimensions of approximately 100 µm by 100 µm for the underlying topographic producing feature generally meet this criterion, but these dimensions may be changed to meet the specific needs of the process. For example, lateral dimensions between about 50 to 1,000 µm are suitable for the underlying topographic feature.

The optical measurement alignment mark is produced on the substrate at a defined position relative to a defined substrate feature, such as a substrate flat or notch on a silicon wafer substrate. Both silicon substrate flats or notches are commonly used in the semiconductor industry. By locating the optical measurement alignment mark at a defined location relative to a substrate feature, such as a semiconductor substrate flat the position of the optical measurement alignment mark is always well-defined and optical measuring devices can be focused on the alignment mark with relative ease.

Referring again to FIGS. 2A and 2B, FIG. 2A shows schematically the top view of the optical measurement alignment mark comprising a first area, 20, which is devoid of any topographic feature and a second area, 21, having a topographic feature, 22. The lateral dimensions of the topographic feature, 22, are approximately 100 µm by 100 µm. Said first area, 20, has lateral dimensions of approximately 100 µm by 100 µm. The optical measurement alignment mark comprising first area, 20, and second area, 21, is formed at a defined location relative to the flat, 23, on semiconductor substrate, 24. FIG. 2B is a cross-sectional representation of the optical measurement alignment mark shown in FIG. 2A.

Figure 3:
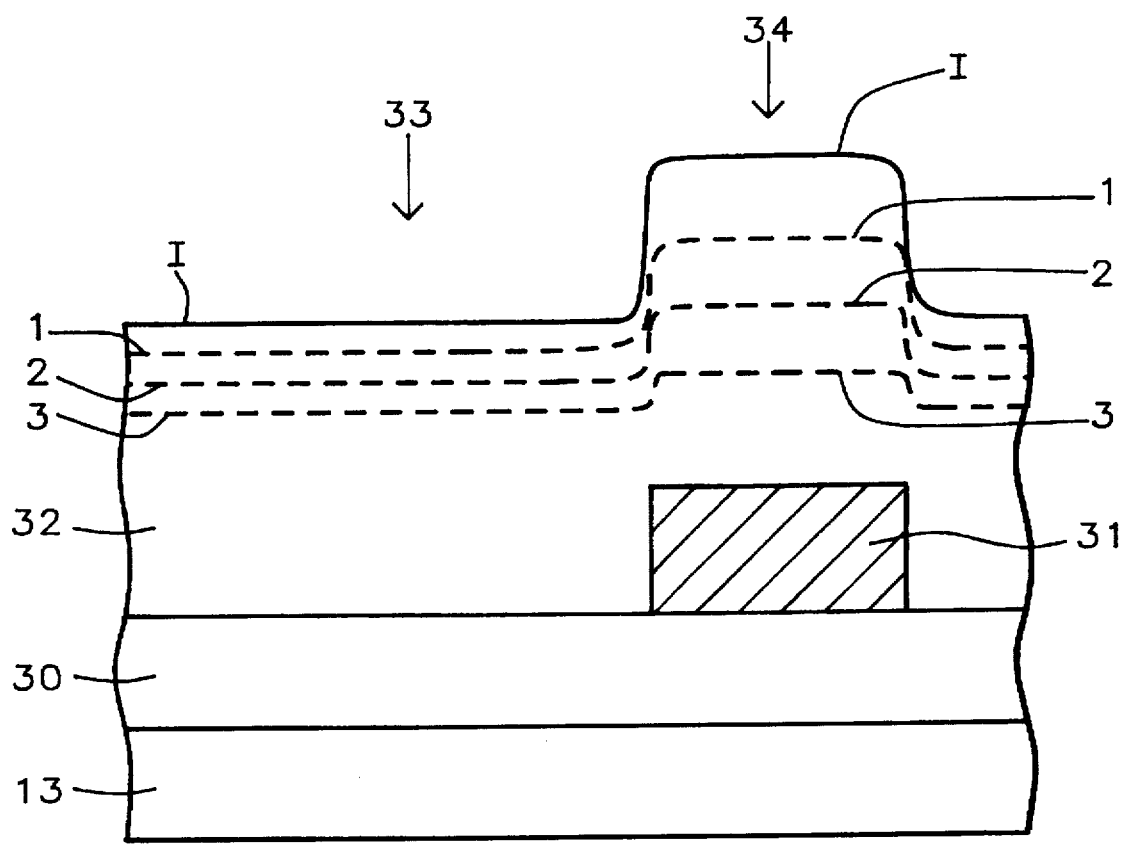
FIG. 3, which schematically, in cross-sectional representation, illustrates progression of planarization at the optical alignment mark during successive CMP iterations.

FIG. 3 schematically represents the use of the optical alignment mark to monitor planarization during CMP of a semiconductor device structure. FIG. 3 shows a cross-sectional representation of the initial monitor structure. First insulator, 30, is deposited by CVD (Chemical Vapor Deposition), LPCVD (Low Pressure Chemical Vapor Deposition), or PECVD (Plasma Enhanced Chemical Vapor Deposition), all common to the semiconductor industry. A suitable process for deposition of first insulator, 30, is CVD, at a temperature between about 200° to 450° C., to a thickness between about 2,000 to 20,000 Angstroms. Alternately, first insulator, 30, may be deposited by SOG (Spin On Glass) and reflow techniques, also common to the semiconductor industry. Topographic feature, 31, comprises an island of metal having lateral dimensions approximately 100 μm by 100 μm and is formed by patterning and subtractive etching of a blanket metal layer. The metal layer has a thickness between about 3,000 to 8,000 Angstroms. Topographic feature, 31, is formed at the same time that an interconnection wiring pattern, comprising aluminum or aluminum-copper-silicon, is formed on the semiconductor substrate. Second insulator, 32, is conformally deposited over the first insulator, 30, over the topographic feature, 31, and over the interconnection wiring pattern (not shown here, because this is not part of this invention). Second insulator, 32, is deposited by CVD (Chemical Vapor Deposition), LPCVD (Low Pressure Chemical Vapor Deposition), or PECVD (Plasma Enhanced Chemical Vapor Deposition), all common to the semiconductor industry. A suitable process for deposition of second insulator, 32, is CVD, at a temperature between about 200° to 450° C., to a thickness between about 2,000 to 20,000 Angstroms. Alternately, second insulator, 32, may be deposited by SOG (Spin On Glass) and fellow techniques, also common to the semiconductor industry. Initial insulator thickness measurements are taken in region, 34, above topographic feature, 31, and in region, 33, which is devoid of topographic features. Optical interferometry, commonly used in the industry, may be used to measure these initial insulator thicknesses.

Referring to FIG. 1 and FIG. 3, chemical-mechanical polishing (CMP) of second insulator, 32, is performed for a selected time, using a polishing slurry comprising abrasive particles, such as silica or alumina, and a chemical etchant at a pH between about pH=9 to pH=14. Rotatable platen and polishing pad, 14, are rotated at a speed between about 10 to 100 rpm. Rotatable substrate carrier, 13, is rotated at a speed between about 10 to 100 rpm. The applied pressure between the rotatable substrate carrier and the rotatable platen and polishing pad is between about 0.1 to 10 psi. Following CMP for the selected time, the semiconductor substrate is transferred from the rotatable substrate carrier to the in-line cleaning station, 11, comprising a water spray nozzle, 15, and an air spray nozzle, 16. Polishing slurry is cleaned from the substrate surface by activating the water spray nozzle, 15, and then the substrate surface is dried by activating the air spray nozzle, 16. After the substrate, 13, is cleaned and dried it is transferred to the optical film thickness measurement device, 12, where insulator thicknesses are again measured by optical interferometric techniques in region, 34, above topographic feature, 31, and in region, 33, which is devoid of topographic features. For illustrative purpose the initial topographic surface is labelled I and the first polished topographic surface is labelled 1. CMP material removal rates are calculated for both regions 33 and 34 by subtracting the corresponding insulator thickness after CMP from the corresponding initial insulator thickness and dividing this difference by the elapsed polishing time. A CMP polish removal rate ratio is then calculated by dividing the removal rate in region 34 by the removal rate in region 33. Typically the removal rate in region 34 will be greater than the removal rate in region 33, indicating that planarization is progressing. Subsequent polished topographic surfaces are labelled 2 and 3 and further illustrate the progression of planarization. After each polish iteration new material removal rates are calculated for both regions 33 and 34. Also, a CMP polish removal rate ratio is calculated after each polish iteration. Typically the CMP polish removal rate ratio will progress from a large numerical value to a numerical value approaching 1.00 as the planarization progresses. Additional chemical-mechanical polishing is performed until said polishing removal rate ratio is less than between about 0.9 to 1.1. Alternately, a second polish removal rate ratio may be computed by dividing the removal rate in region 33 by the removal rate in region 34 and additional chemical-mechanical polishing is performed until said second polish removal rate ratio is greater that between about 1.1 to 0.9.

While the invention has been particularly shown and described with reference to the preferred embodiments thereof, it will be understood by those skilled in the art that various changes in form and details may be made without departing from the spirit and scope of the invention.

What is claimed is:

1. An apparatus for planarizing semiconductor substrates comprising:

a rotatable platen and polishing pad for chemical-mechanical polishing (CMP) an insulating layer deposited over a metallization pattern formed on the surface of a semiconductor substrate;

a reservoir for a polishing slurry and means to dispense the slurry onto the polishing pad;

a rotatable substrate carrier and means for holding the surface of the semiconductor substrate in juxtaposition relative to said rotatable platen and polishing pad with an applied pressure between the rotatable substrate carrier and the rotatable platen and polishing pad;

a means to transfer the semiconductor substrate from the rotatable substrate carrier to an in-line cleaning station comprising a water spray nozzle and an air spray nozzle;

a means to transfer the semiconductor substrate from the in-line cleaning station to an in-line optical thickness measurement tool;

a means to align the semiconductor substrate in the in-line optical thickness measurement tool;

a means to measure the thickness of the insulating layer over said metallization pattern before and after polishing;

a means to measure the thickness of the insulating layer over said semiconductor substrate before and after polishing;

a means to compute a first polish removal rate of said insulating layer over said metallization pattern;

a means to compute a second polish removal rate of said insulating layer over said semiconductor substrate;

a means of computing a polish removal rate ratio by dividing said first polish removal rate by said second polish removal rate; and a means to transfer the semiconductor substrate from the in-line optical thickness measurement tool to the rotatable substrate carrier for additional chemical-mechanical polishing (CMP) until said polish removal rate ratio is less than between about 0.9 to 1.1.

2. The apparatus of claim 1, wherein said rotatable platen and polishing pad are rotated at a speed between about 10 to 100 rpm.

3. The apparatus of claim 1, wherein said rotatable substrate carrier is rotated at a speed between about 10 to 100 rpm.

4. The apparatus of claim 1, wherein said applied pressure between the rotatable substrate carrier and the rotatable platen and polishing pad is between about 0.1 to 10 psi.

5. The apparatus of claim 1, wherein said polishing slurry comprises abrasive particles and a chemical etchant at a pH between about pH=9 to pH=14.

6. The apparatus of claim 1, wherein said metallization pattern comprises a metal island having length and width dimensions between about 50 to 1,000 µm.

7. The apparatus of claim 1, wherein said metallization pattern has a thickness between about 3,000 to 8,000 Angstroms.

8. The apparatus of claim 1, wherein said insulating layer is silicon oxide.

9. The apparatus of claim 1, wherein the means to measure the thickness of the insulating layer over said metallization pattern is optical interferometry.

10. The apparatus of claim 1, wherein the means to measure the thickness of the insulating layer over said semiconductor substrate is optical interferometry.

11. A method of chemical-mechanical polishing (CMP) a semiconductor substrate comprising:

depositing a first insulating layer on said semiconductor substrate;

forming a metallization pattern on said first insulating layer;

conformally depositing a second insulating layer over said first insulating layer and said metallization pattern;

measuring the thickness of said second insulating layer over said metallization pattern;

measuring the combined thicknesses of said second insulating layer and said first insulating layer over said semiconductor substrate;

performing chemical-mechanical polishing (CMP) of said second insulating layer;

transferring said semiconductor substrate to an in-line cleaning station comprising a water spray nozzle and an air spray nozzle;

removing the polishing slurry from the semiconductor substrate with water from said water spray nozzle;

drying the semiconductor substrate with air from said air spray nozzle;

transferring said semiconductor substrate to an in-line optical thickness measurement tool;

aligning said semiconductor substrate in said in-line optical thickness measurement tool;

remeasuring, after chemical-mechanical polishing (CMP), the thickness of said second insulating layer over said metallization pattern;

remeasuring, after chemical-mechanical polishing (CMP), the combined thicknesses of said second insulating layer and said first insulating layer over said semiconductor substrate;

computing a first polish removal rate of said second insulating layer over said metallization pattern;

computing a second polish removal rate of said second insulating layer over said semiconductor substrate;

computing a polish removal rate ratio by dividing said first polish removal rate by said second polish removal rate; and performing additional chemical-mechanical polishing (CMP) until said polish removal rate ratio is less than between about 0.9 to 1.1.

12. The method of claim 11, wherein said first insulating layer is silicon oxide.

13. The method of claim 12, wherein said silicon oxide is deposited using CVD (Chemical Vapor Deposition) processing, at a temperature between about 200° to 450° C., to a thickness between about 2,000 to 20,000 Angstroms.

14. The method of claim 11, wherein said metallization pattern comprises a metal island having length and width dimension between about 50 to 1,000 µm.

15. The method of claim 14, wherein said metal island has a thickness between about 3,000 to 8,000 Angstroms.

16. The method of claim 14, wherein said metal island is aluminum.

17. The method of claim 14, wherein said metal island is aluminum-copper-silicon.

18. The method of claim 11, wherein said second insulating layer is silicon oxide.

19. The method of claim 18, wherein said silicon oxide is deposited using CVD (Chemical Vapor Deposition) processing, at a temperature between about 200° to 450° C., to a thickness between about 2,000 to 20,000 Angstroms.

20. The method of claim 11, wherein measuring the thickness of said second insulating layer over said metallization pattern is done by optical interferometry.

21. The method of claim 11, wherein measuring the combined thicknesses of said second insulating layer and said first insulating layer over said semiconductor substrate is done by optical interferometry.

22. The method of claim 11, wherein said chemical-mechanical polishing of said second insulating layer is performed using a polishing slurry containing abrasive particles and a chemical etchant, at a pH between about pH=9 to pH=14.

23. The method of claim 11, wherein remeasuring, after chemical-mechanical polishing, the thickness of said second insulating layer over said metallization pattern is done by optical interferometry.

24. The method of claim 11, wherein remeasuring, after chemical-mechanical polishing, the combined thicknesses of said second insulating layer and said first insulating layer over said semiconductor substrate is done by optical interferometry.

25. A method of chemical-mechanical polishing (CMP) a semiconductor substrate comprising:

depositing a first insulating layer on said semiconductor substrate;

forming a metallization pattern on said first insulating layer;

conformally depositing a second insulating layer over said first insulating layer and said metallization pattern;

measuring the thickness of said second insulating layer over said metallization pattern;

measuring the combined thicknesses of said second insulating layer and said first insulating layer over said semiconductor substrate;

performing chemical-mechanical polishing (CMP) of said second insulating layer;

transferring said semiconductor substrate to an in-line cleaning station comprising a water spray nozzle and an air spray nozzle;

removing the polishing slurry from the semiconductor substrate with water from said water spray nozzle;

drying the semiconductor substrate with air from said air spray nozzle;

transferring said semiconductor substrate to an in-line optical thickness measurement tool;

aligning said semiconductor substrate in said in-line optical thickness measurement tool;

remeasuring, after chemical-mechanical polishing (CMP), the thickness of said second insulating layer over said metallization pattern;

remeasuring, after chemical-mechanical polishing (CMP), the combined thicknesses of said second insulating layer and said first insulating layer over said semiconductor substrate;

computing a first polish removal rate of said second insulating layer over said metallization pattern;

computing a second polish removal rate of said second insulating layer over said semiconductor substrate;

computing a polish removal rate ratio by dividing said second polish removal rate by said first polish removal rate; and performing additional chemical-mechanical polishing (CMP) until said polish removal rate ratio is greater than between about 0.9 to 1.1.

26. The method of claim 25, wherein said first insulating layer is silicon oxide.

27. The method of claim 25, wherein said silicon oxide is deposited using CVD (Chemical Vapor Deposition) processing, at a temperature between about 200° to 450° C., to a thickness between about 2,000 to 20,000 Angstroms.

28. The method of claim 25, wherein said metallization pattern comprises a metal island having length and width dimension between about 50 to 1,000 µm.

29. The method of claim 28, wherein said metal island has a thickness between about 3,000 to 8,000 Angstroms.

30. The method of claim 28, wherein said metal island is aluminum.

31. The method of claim 28, wherein said metal island is aluminum-copper-silicon.

32. The method of claim 25, wherein said second insulating layer is silicon oxide.

33. The method of claim 32, wherein said silicon oxide is deposited using CVD (Chemical Vapor Deposition) processing, at a temperature between about 200° to 450° C., to a thickness between about 2,000 to 20,000 Angstroms.

34. The method of claim 25, wherein measuring the thickness of said second insulating layer over said metallization pattern is done by optical interferometry.

35. The method of claim 25, wherein measuring the combined thicknesses of said second insulating layer and said first insulating layer over said semiconductor substrate is done by optical interferometry.

36. The method of claim 25, wherein said chemical-mechanical polishing of said second insulating layer is performed using a polishing slurry containing abrasive particles and a chemical etchant, at a pH between about pH=9 to pH=14.

37. The method of claim 25, wherein remeasuring, after chemical-mechanical polishing, the thickness of said second insulating layer over said metallization pattern is done by optical interferometry.

38. The method of claim 25, wherein remeasuring, after chemical-mechanical polishing, the combined thicknesses of said second insulating layer and said first insulating layer over said semiconductor substrate is done by optical interferometry.

* * * * *

UNITED STATES PATENT AND TRADEMARK OFFICE
CERTIFICATE OF CORRECTION

PATENT NO. : 5,705,435
DATED : 1/6/98
INVENTOR(S) : Lai-Juh Chen

It is certified that error appears in the above-indentified patent and that said Letters Patent is hereby corrected as shown below: Title Page:

Item [75], correct Inventor's name from "Lai-Tuh Chen" to --Lai-Juh Chen--

Signed and Sealed this

Fourteenth Day of April, 1998

Attest:

BRUCE LEHMAN

Attesting Officer

Commissioner of Patents and Trademarks